United States Patent [19]
McClure

[11] Patent Number: 5,939,914
[45] Date of Patent: Aug. 17, 1999

[54] SYNCHRONOUS TEST MODE INITIALIZATION

[75] Inventor: David Charles McClure, Carrollton, Tex.

[73] Assignee: STMicroelectronics, Inc., Carrollton, Tex.

[21] Appl. No.: 08/980,323

[22] Filed: Nov. 28, 1997

Related U.S. Application Data

[62] Division of application No. 08/588,729, Jan. 19, 1996, Pat. No. 5,767,709.

[51] Int. Cl.$^6$ ........................................................ H03K 5/13
[52] U.S. Cl. ............................ 327/198; 327/142; 327/298
[58] Field of Search ..................... 327/309, 321, 327/327, 328, 276, 278, 281, 291, 298, 299, 142, 198; 326/56–58, 86, 87; 365/201

[56] References Cited

U.S. PATENT DOCUMENTS

| | | | |
|---|---|---|---|
| 5,668,492 | 9/1997 | Pedersen et al. | 327/291 |
| 5,714,892 | 2/1998 | Bowers et al. | 326/60 |
| 5,767,696 | 6/1998 | Choi | 326/56 |

FOREIGN PATENT DOCUMENTS

| | | | |
|---|---|---|---|
| 2-214220 | 8/1990 | Japan | 326/121 |

*Primary Examiner*—Tuan T. Lam
*Attorney, Agent, or Firm*—Theodore E. Galanthay; Lisa K. Jorgenson; Renee M. Larson

[57] ABSTRACT

The entire data path of a synchronous integrated circuit device is initialized in a test mode upon power-up of the synchronous integrated circuit device. Upon power-up of the integrated circuit device in the test mode, a clock signal (either an external clock signal or an associated internal clock signal) is internally clocked. As the clock signal goes to a low logic state upon power-up of the device, a master latch (flip-flop) element of the integrated circuit device is loaded with data and is allowed to conduct; a slave latch (flip-flop) element of the integrated circuit device does not conduct. As the clock signal goes to a high logic state, the data in the master latch is latched. Also upon the high logic state of the clock, the slave latch element is loaded with data and is allowed to conduct.

13 Claims, 4 Drawing Sheets

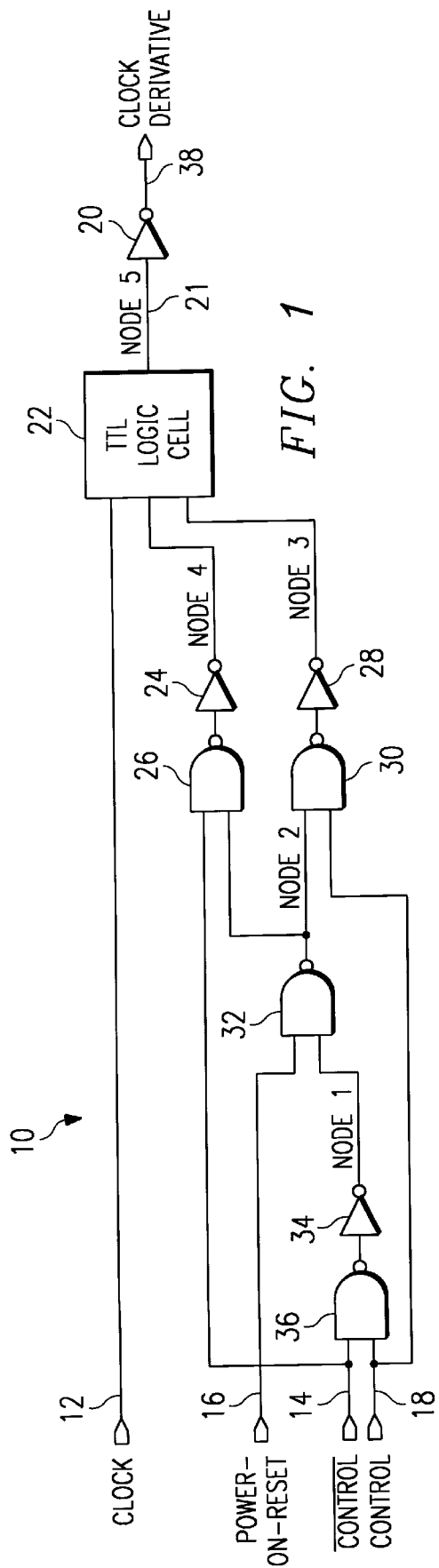
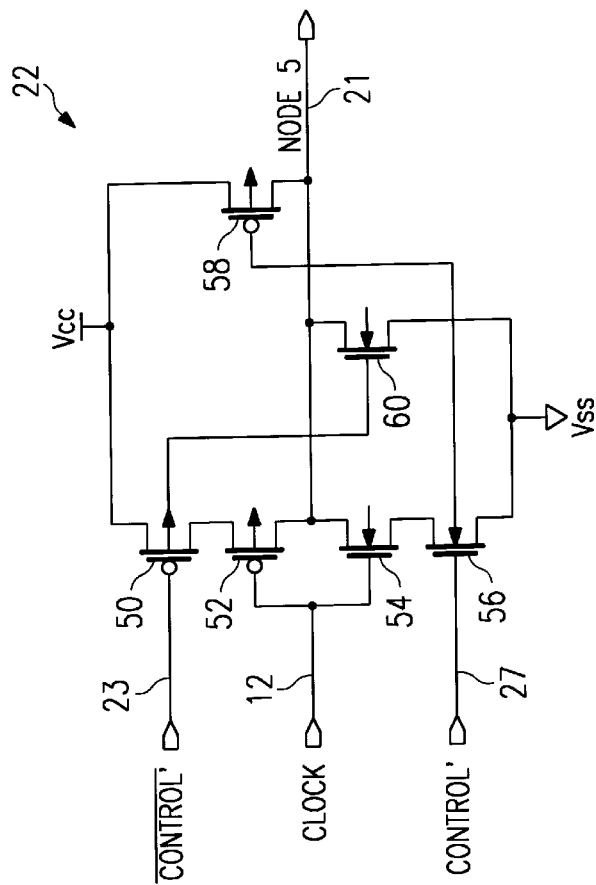
FIG. 1
FIG. 1a

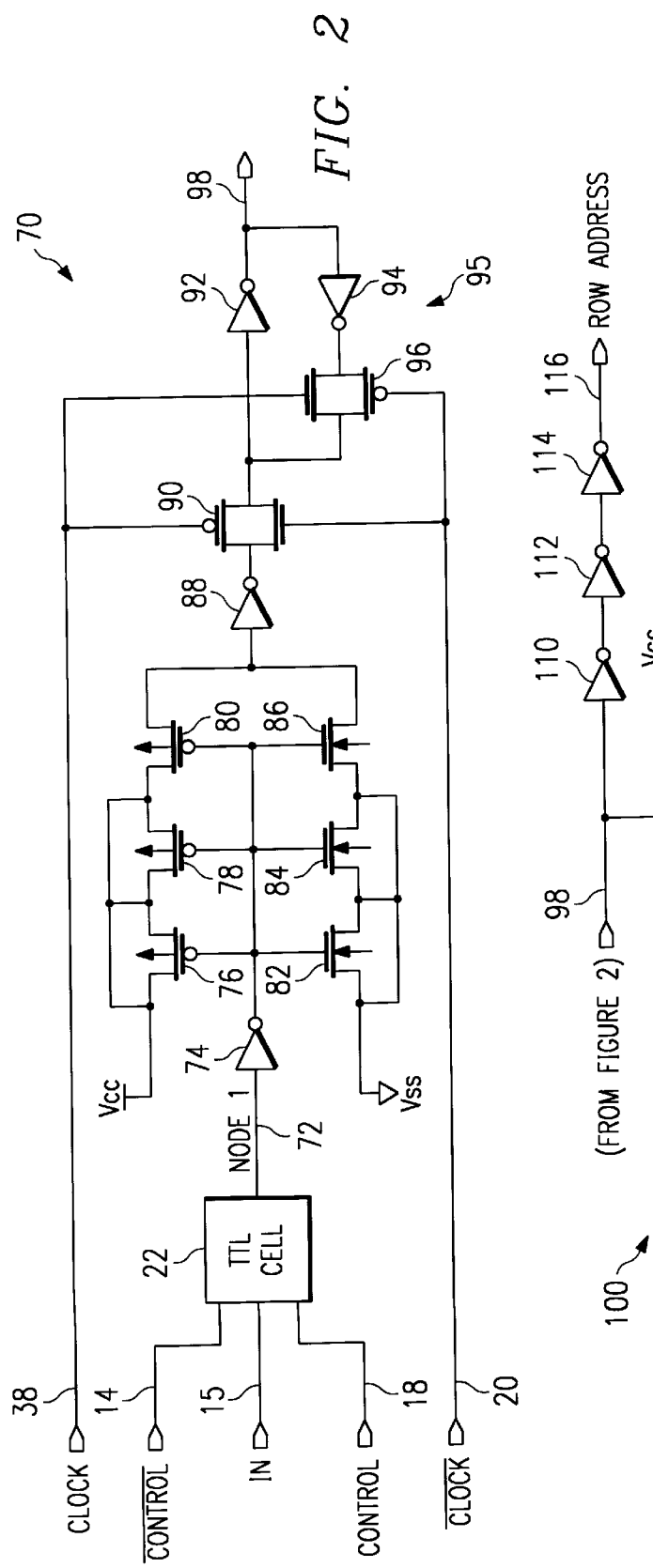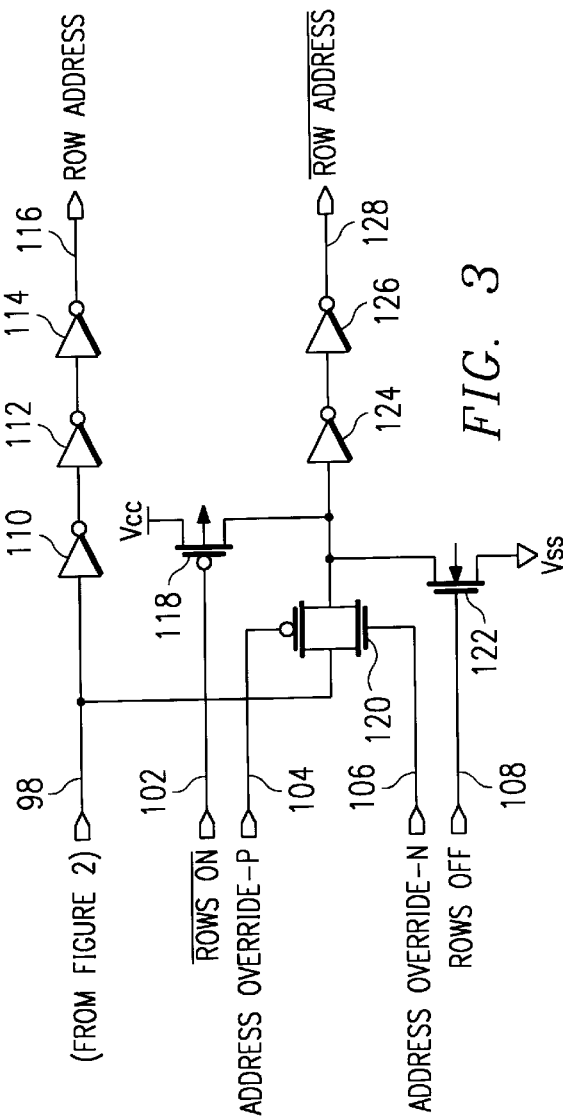
FIG. 2
FIG. 3

SYNCHRONOUS TEST MODE INITIALIZATION

This is a Division, of application Ser. No. 08/588,729, filed Jan. 19, 1996.

CROSS REFERENCE TO RELATED APPLICATIONS

The subject matter of the present application is related to copending U.S. application Ser. No. 08/173,197, filed Dec. 22, 1993, titled "Improved Static Memory Long Write Test", attorney docket no. 93-C-82, copending U.S. application Ser. No. 08/172,854, filed Dec. 22, 1993, titled "Stress Test Mode", attorney docket no. 93-C-56 all of which are assigned to SGS-Thomson Microelectronics, Inc. and expressly incorporated herein by reference.

Additionally, the following pending U.S. Patent Applications by David Charles McClure entitled:

"Architecture Redundancy", Ser. No. 08/582,484 (Attorney's Docket No. 95-C136), and "Redundancy Control", Ser. No. 08/580,827 (Attorney's Docket No. 95-C-143), which were both filed on Dec. 29, 1995, and have the same ownership as the present application, and to that extent are arguable related to the present application, which are herein incorporated by reference;

and entitled:

"Test Mode Activation and Data Override", Ser. No. 08/587,709 (Attorney's Docket No. 95-C-137), "Pipelined Chip Enable Control Circuitry and Methodology", Ser. No. 08/588,730 (Docket No. 95-C-138), "Output Driver Circuitry Having a Single Slew Rate Resistor", Ser. No. 08/588,988 (Docket No. 95-C-139), "Synchronized Stress Test Control", Ser. No. 08/589,015 (Docket No. 95-C-142), "Write Pass Through Circuit", Ser. No. 08/588,662 (Attorney's Docket No. 95-C-144), "Data-input Device for Generating Test Signals on Bit and Bit-Complement Lines", Ser. No. 08/588,762 (Afforney's Docket No. 95-C-145), "Synchronous Output Circuit", Ser. No. 08/588,901 (Attorney's Docket No. 95-C-146), "Write Driver Having a Test Function", Ser. No. 08/589,141 (Attorney's Docket No. 95-C-147), "Circuit and Method for Tracking the Start of a Write to a Memory Cell", Ser. No. 08/589,139 (Attorney's Docket No. 95-C-148), "Circuit and Method for Terminating a Write to a Memory Cell", Ser. No. 08/588,737 (Attorney's Docket No. 95-C-149), "Clocked Sense Amplifier with Wordline Tracking", Ser. No. 08/587,728 (Attorney's Docket No. 95-C-150), "Memory-Row Selector Having a Test Function", Ser. No. 08/589,140 (Attorney's Docket No. 95-C-151), "Device and Method for Isolating Bit Lines from a Data Line", Ser. No. 08/588,740 (Attorney's Docket No. 95-C-154), "Circuit and Method for Setting the Time Duration of a Write to a Memory Cell", Ser. No. 08/587,711 (Attorney's Docket No. 95-C-156), "Low-Power Read Circuit and Method for Controlling A Sense Amplifier", Ser. No. 08/589,024, U.S. Pat. No. 5,619,466 (Attorney's Docket No. 95-C-168), "Device and Method for Driving a Conductive Path with a Signal", Ser. No. 08/587,708 (Attorney's Docket No. 169), and the following pending U.S. Patent Applications by Mark A. Lysinger entitled:

"Burst Counter Circuit and Method of Operation Thereof", Ser. No. 08/589,023 (Attorney's Docket No. 95-C-141), "Switching Master/Slave Circuit", Ser. No. 08/588,648 (Attorney's Docket No. 96-C-03), which have the same effective filing data and ownership as the present application, and to that extent are arguably related to the present application, are incorporated herein by reference.

BACKGROUND OF THE INVENTION

The present invention relates generally to the testing of integrated circuit devices, and more specifically to the testing of synchronous integrated circuit devices having a stress test mode or other test mode.

Stress test modes are commonly used in modem synchronous integrated circuit devices to subject the integrated circuit device to various types of tests which "stress" the device. It is important to stress various element and signals of the device for maximum fault coverage. For instance, the external clock signal supplied to the integrated circuit device is an important signal to test because it controls many of the gates contained within the device. Thus, for maximum fault coverage of the device, it is important to stress the external clock signal both at a low logic state and a high logic state. Difficulties are encountered in trying to establish the logic states of the device during a stress test mode. These difficulties are encountered in a memory cell stress test mode of the device, in which all rows and columns are enabled and bitlines true or bitlines complement of the memory cell are pulled to power supply voltage Vss, or in a periphery stress test mode in which all rows and columns of the device are disabled. The difficulty lies in the fact that master/slave latches on the inputs of the integrated circuit device do not allow data to flow all the way through the device since only one master latch or one slave latch will conduct at a time.

Another prior art problem encountered with synchronized integrated circuit test modes is that entering a test mode after the integrated circuit device has been powered-up can result in device latch-up. Once the device powers-up, it has initialized to a certain voltage, such as 3 volts or 5 volts. Transition to a test mode from this voltage condition causes huge current spikes which can result in device latch-up as all the rows, columns, bitlines, etc. of the device simultaneously switch from a normal operating mode to a test mode. It would thus be desirable to enter a test mode upon power-up of the device in order to avoid possible device latch-up.

There is thus an unmet need in the art to be able to initialize the entire data path of an integrated circuit device in a test mode during device power-up and to be able to adequately test the external clock signal of the device or a derivative clock signal thereof in both a high logic state and a low logic state.

SUMMARY OF THE INVENTION

It is an object of the present invention to initialize the entire data path of an integrated circuit device during a test mode upon power-up of the synchronous integrated circuit device.

It is further an object of the present invention to adequately test the external clock signal or internal clock signals associated with the external clock signal of the synchronous integrated circuit device.

Therefore, according to the present invention, the entire data path of the synchronous integrated circuit device is initialized in a test mode upon power-up of the integrated circuit device. Upon power-up of the integrated circuit device in the test mode, a clock signal (either an external clock signal or an associated internal clock signal) is internally clocked. As the clock signal goes to a low logic state upon power-up of the device, a master latch (flip-flop) element of the integrated circuit device is loaded with data and is allowed to conduct; a slave latch (flip-flop) element of the integrated circuit device does not conduct. As the clock signal goes to a high logic state, the data in the master latch is latched. Also upon the high logic state of the clock, the slave latch element is loaded with data and is allowed to conduct.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 1 is a schematic diagram of a clock input buffer, according to a preferred embodiment of the present invention;

FIG. 1a is a schematic diagram of a TTL (transistor transistor logic) cell, according to the preferred embodiment of the present invention;

FIG. 2 is a schematic diagram of an address input buffer, according to the preferred embodiment of the present invention;

FIG. 3 is a schematic diagram of row address driver circuitry, according to the preferred embodiment of the invention;

DESCRIPTION OF THE INVENTION

Figure 4:
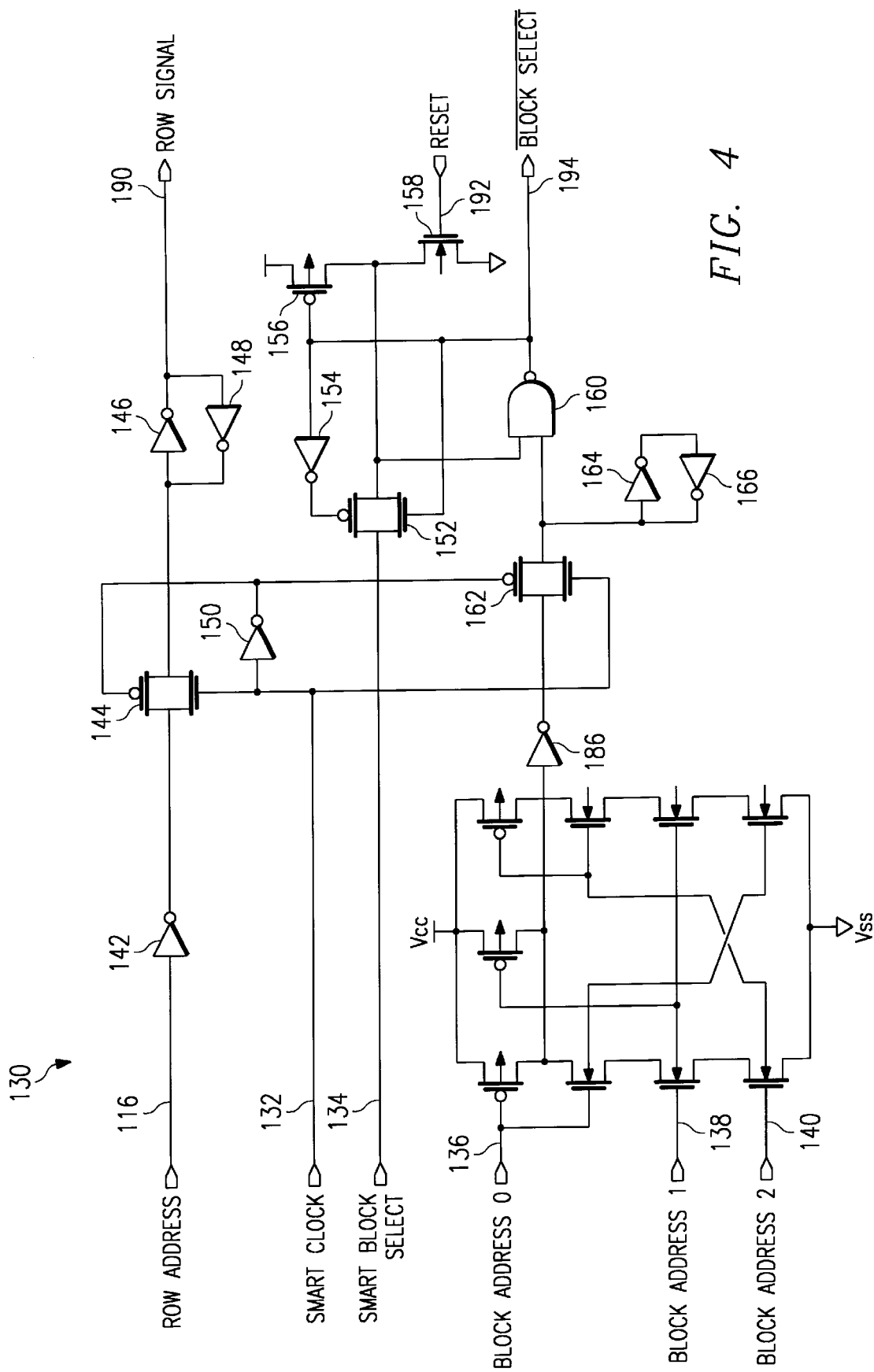
FIG. 4 is a schematic diagram of word line and block select latch circuitry, according to the preferred embodiment of the invention.

The entire data path of a synchronous integrated circuit device is initialized in a test mode upon power-up of the integrated circuit device. Upon power-up of the integrated circuit device in the test mode, a clock signal (either an external clock signal or an associated internal clock signal) is internally clocked. As the clock signal goes to a low logic state upon power-up of the device, a master latch (flip-flop) element of the integrated circuit device is loaded with data and is allowed to conduct; a slave latch (flip-flop) element of the integrated circuit device does not conduct. As the clock signal goes to a high logic state, the data in the master latch is latched. Also upon the high logic state of the clock, the slave latch element is loaded with data and is allowed to conduct. Using the present invention, both the master and slave latch elements are sequentially loaded with the correct data state and then allowed to sequentially conduct.

Conduction of the master latch elements and conduction of the slave latch elements initializes an address path of the integrated circuit device such that either no columns or rows of the integrated circuit device are selected or such that all columns or rows of the integrated circuit device are selected. If all columns and rows of the integrated circuit device are selected, all bitlines true of the integrated circuit device are held at a first voltage level and all bitlines complement of the integrated circuit device are held at a second voltage level.

FIGS. 1 and 1a illustrate the clock control circuitry which controls the external clock or derivative signal thereof of the synchronous integrated circuit device. FIGS. 2 to 6 illustrate the address control circuitry which are driven by the clock circuitry of FIG. 1. Referring to FIG. 1, a schematic diagram of a clock input buffer 10, according to a preferred embodiment of the present invention, is shown. Clock input buffer 10 is provided with Clock signal 12, Power-On-Reset signal 16, Control bar signal 14 and Control signal 18. Clock signal 12 is equal to the external clock signal provided to a clock pin of the integrated circuit device or is a derivative signal thereof and is provided as an input signal to TTL clock cell 22, shown in FIG. 1a. The power-on-reset signal is an internally generated signal which changes logic state once a threshold value of positive power supply Vcc is passed as Vcc rises. Control signal 18 and Clock bar signal 14 are provided to NAND logic gate 36 as input signals. The output signal of NAND logic gate 36 is inverted by inverter 34 before being presented to a second NAND logic gate 32 as an input signal. The second input signal of NAND logic gate 32 is Power-On-Reset signal 16. The output signal of NAND logic gate 32 feeds both NAND logic gates 26 and 30. A second input signal to NAND logic gate 26 is Control bar signal 14 and a second input signal to NAND logic gate 30 is Control signal 18. The output signal of NAND logic gate 26 is inverted by inverter 24 and the output signal of inverter 24 is an input signal to TTL Clock Cell 22. The output signal of NAND logic gate 30 is inverted by inverter 28 and the output signal of inverter 28 is another input signal to TTL Clock Cell 22. The output signal of TTL Clock Cell 22 is inverted by inverter 20 to produce Clock Derivative signal 38.

Control bar signal 14 and Control signal 18 control TTL cell 22 shown in FIG. 1a. TTL cell 22 contains the following elements: p-channel MOS transistors 50, 52 and 58 and n-channel MOS transistors 54, 56 and 60. The gates of transistors 50 and 60 are supplied with Control bar signal 14. The gates of transistors 52 and 54 are supplied with Clock signal 12, and the gates of transistors 56 and 58 are supplied with the Control signal 18. A first source/drain of transistor 50 and a first source/drain of transistor 58 are connected to power supply voltage Vcc as shown. A second source/drain of transistor 50 is connected to a first source/drain of transistor 52. A second source/drain of transistor 52 is connected to a first source/drain of transistor 54, a first source/drain of transistor 60 and a second source/drain of transistor 58 to form output signal 23 on Node 5. A second source/drain of transistor 54 is connected to a first source/drain of transistor 56. A second source/drain of transistor 56 is connected to a second source/drain of transistor 60 and power supply voltage Vss.

When in the periphery stress test mode Control bar signal 14 and Control signal 18 are a high logic state. Referring again to FIG. 1, during power-up of the integrated circuit device Power-On-Reset signal 16 pulses high. When Power-On-Reset signal 16, Control bar signal 14 and Control signal 18 are all a high logic state, Node 1 of FIG. 1 is a high logic state and Node 2 is a low logic state, which means that Node 3 and Node 4 are both a low logic state. Once Power-On-Reset signal 16 goes to a low logic state, Node 2 goes to a high logic state. Node 3 and Node 4 are equal to the logic state of Control bar signal 14 and Control signal 18 both of which are now a high logic state.

Referring once more to FIG. 1a, during power-up in a periphery stress test mode, Control' bar signal 23 (shown at Node 3 of FIG. 1) and Control' signal 27 (shown at Node 4 of FIG. 1) are both a low logic state and signal 21 at Node 5 is forced to a high logic state. This gives the appearance that Clock input signal 12 was a low logic state. Conversely, when Control' bar signal 23 and Control' signal 27 go to high logic states, signal 21 is forced to a low logic state which gives the appearance that Clock signal 12 was a high logic state. Thus, a high logic state on controls signals Control' bar signal 23 and Control' signal 27 during a periphery stress test mode forces the equivalent of a high going clock input. During a memory cell stress test mode, the equivalent of a low going clock input is forced. Upon power-up of the device, Power-On-Reset signal 16 goes high and Clock signal 12 is forced to a low logic state during which the master latch of the device is loaded with data and allowed to conduct. Following completion of the power-on reset cycle, Power-On-Reset signal 16 goes low and data is latched into the master latch; also data is loaded into the slave latch which is allowed to device conduct. Using the circuitry of FIG. 1a, the state of Clock signal 12 is forced to the desired logic state during a test mode, either a periphery stress test mode or a memory cell stress test mode.

The operation of FIG. 1a to force the condition of the Clock signal 12 as desired may be further illustrated with reference to a second input buffer circuit. Referring to FIG. 2, a schematic diagram of an address input buffer 70, according to the preferred embodiment of the present invention, is shown. Input buffer 70 includes the following elements: TTL (transistor transistor logic) cell 22, inverters 74, 88, 92 and 94, and passgates 90 and 96. The details of TTL cell 22 are similar to those shown in FIG. 1a. Input buffer 70 contains a master latch 95 comprised of elements inverter 92, inverter 94 and passgate 96. Input buffer 70 is supplied with the following input signals: Clock signal 38, Control bar signal 14, IN data signal 15, Control signal 18 and Clock bar signal 13 and generates output signal 98.

When Control bar signal 14 and Control signal 18 are both a high logic state, signal 72 at Node 1 is a low logic state. Because of the way the TTL cell of FIG. 1a forces Clock signal 38 to the desired logic state, Clock signal 38 is initially a low logic state but will ultimately go to a high logic state so that the master latch 95 initially conducts, thereby forcing signal 98 to a high logic state. Clock signal 12 will then go to a high logic state, turning off master latch 95.

Signal 98 propagates to Row Address Driver circuitry 100 of FIG. 3, according to the preferred embodiment of the invention. Row address driver circuitry 100 is composed of inverters 110, 112, 114, 124 and 126, p-channel MOS transistor 118, n-channel MOS transistor 122, and passgate 120. Signal 98 from FIG. 1 is provided to a series of inverters 110, 112 and 114 which delay and inverter signal 98 to produce Row Address signal 116. Signal 98 is also presented to passgate 120 which is controlled by Address Override-P signal 104 and Address Override-N signal 106. The output signal of passgate 120 is pulled up towards Vcc by p-channel transistor 118 whose gate is controlled by Rows On bar signal 102 and is pulled down towards Vss by n-channel transistor 122 whose gate is controlled by Rows Off signal 108. The output signal of passgate 120 passes through two inverters 124 and 126 to become Row Address bar signal 128. Row Address bar signal 128 is the inverse of Row Address signal 116. Rows On bar signal 102 forces Row Address signal 116 on (in an asserting condition) when it is a low logic state in the test mode and Rows Off signal 108 forces Row Address signal 116 off (not in an asserting condition) when it is a high logic state in the test mode. P-channel MOS transistor 118 and n-channel MOS transistor 122 act as row address override devices in the test mode.

Rows On bar signal 102 and Rows Off signal 108 are controlled based upon which type of test mode being entered: a memory cell stress mode in which all rows are enabled or a periphery stress mode in which all the rows are disabled. Based on the logic states of signal 98, Rows On bar signal 102 and Rows Off signal 108 and further based upon the fact that Address Override-P signal 104 is a high logic state and Address Override-N signal 106 is a low logic state in any test mode, Row Address signal 1 16 and Row Address bar signal 128 are both forced to a high logic state in a memory cell stress mode in an asserting condition for the Word Line and Block Select Latch circuitry 130 of FIG. 4 or are both forced to a low logic state in a periphery stress mode.

The Row Address signal 116 generated by FIG. 3 feeds the Word Line and Block Select Latch circuitry 130 shown in FIG. 4, according to the preferred embodiment of the invention. In addition to Row Address signal 116, circuitry 130 is supplied with Smart Clock signal 132, Smart Block Select signal 134, Block Address0 signal 136, Block Address1 signal 138 and Block Address2 signal 140, and Reset signal 192. Circuitry 130 generates Row signal 190 and Block Select bar signal 194. Smart Clock signal 132 is a high-going narrow pulse generated from the rising edge of Clock signal 12 and Smart Block Select signal 134 is a derivative signal of Smart Clock signal 132. The elements of circuitry 130 include: inverters 142, 146,148, 150,154, 164, 166 and 186; passgates 144, 152 and 162; NAND logic gate 160; p-channel MOS transistors 156, 168, 170, 172; and n-channel MOS transistors 174, 176, 178,180, 182 and 184.

Row Address signal 116 is supplied by FIG. 3 to the input terminal of inverter 142. Smart Clock signal 132 is provided to a control terminal of both passgates 144 and 152 as shown and accordingly controls passgates 144 and 152; it additionally is provided to the input terminal of inverter 150. Smart Block Select signal 134 is an input signal to passgate 152 which is indirectly controlled by Block Address signals 136, 138 and 140. Block Address0 signal 136 is provided to the gates of transistors 168,174 and 184. Block Address1 signal 138 is provided to the gates of transistors 178, 170 and 180. Block Address2 signal 140 is provided to the gates of transistors 182,172 and 176.

The output terminal of 142 provides an inverted row address signal to passgate 144. The output of slave passgate 144 is provided to the input terminal of inverter 146 which produces Row output signal 190. The output terminal of inverter 150 controls a control terminal of both passgates 144 and 162 while Smart Clock signal 132 controls the other control terminal of passgates 144 and 162 as shown.

Following the powering-up of the integrated circuit device which is controlled by Power-On-Reset signal 16, Power-On-Reset signal 16 goes low and Clock signal 12 goes from a low logic state to a high logic state. This also causes Smart Clock signal 132 to go to the high logic state since Smart Clock signal 132 is a derivative signal of Clock signal 12, as previously discussed. A high logic state of Smart Clock signal 132 causes slave latch member 144 to load in data supplied by Row Address signal 116 and to conduct. Thus, the conduction of slave latch 144 follows the conduction of the master latch of FIGS. 1 and 1a.

Figure 5:
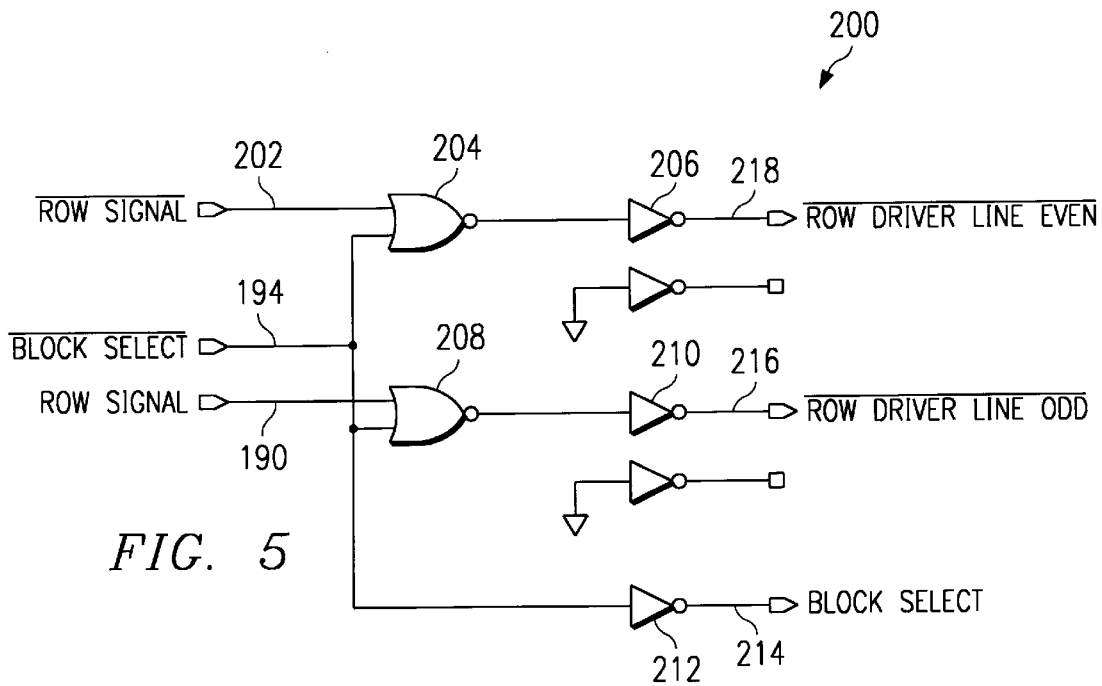
FIG. 5 is a schematic diagram of word line select circuitry, according to the preferred embodiment of the present invention.

The Row signal 190 and Block Select bar signal 194 generated by circuitry 130 are supplied to Word Line Select circuitry 200 of FIG. 5, according to the preferred embodiment of the present invention. In addition to signals 190 and 194 circuitry 200 is provided with Row bar signal 202, which is the inverse of Row signal 190. The elements of circuitry 200 include NOR logic gates 204 and 208; and inverters 206, 210 and 212. Circuitry 200 produces signal Row Driver Line even bar signal 218, Row Driver Line odd bar signal 216 and Block Select signal 216 (the inverse signal of Block Select bar signal 194).

Figure 6:
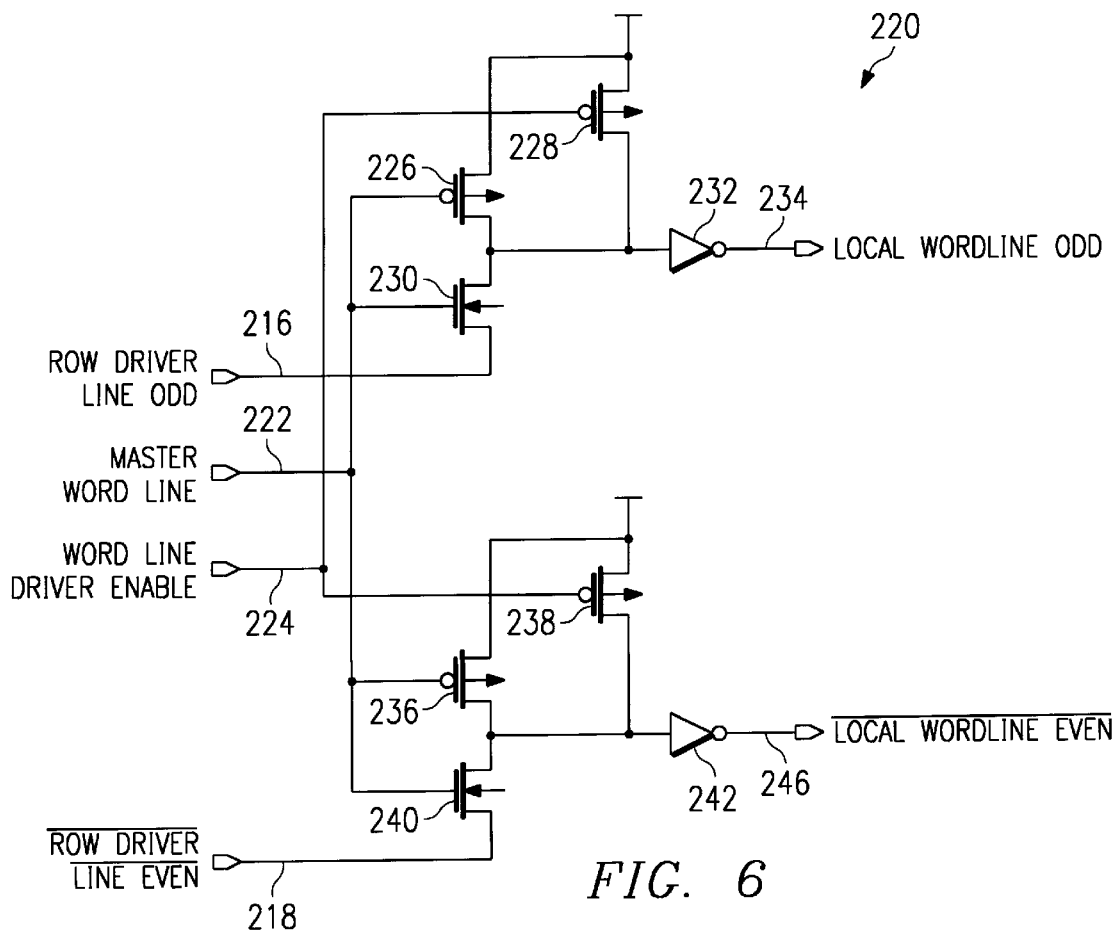
FIG. 6 is a schematic diagram of local wordline driver circuitry, according to the preferred embodiment of the present invention.

Row Driver Line odd bar signal 216 and Row Driver Line even bar signal 218 from circuitry 200 feeds the Local Wordline Driver circuitry 220 of FIG. 6, according to the preferred embodiment of the present invention. Circuitry 220 in addition to signals 216 and 218 is provided with a Master Word Line signal 222 and Word Line Driver Enable signal 224. The elements of circuitry 220 include p-channel MOS transistors 226, 228, 236 and 238; n-channel MOS transistors 230 and 240; and inverters 232 and 242. Circuitry 220 produces Local Wordline odd signal 234 and Local Wordline even bar signal 246. When Row Driver Line odd bar signal 216 and Row Driver Line even bar signal 218 are both a high logic state, Local Wordline Odd signal 234 and Local Wordline even bar signal 246 will be off ( a low logic state). Since Local Wordline Odd signal 234 and Local Wordline even bar signal 246 are the local wordlines of the device, all wordlines of the device are off.

The internal clocking of the synchronous integrated circuit device described above provides several advantages over the prior art. The entire data path of a synchronous integrated circuit device may be set up based upon exercising only the internally generated power-on-reset signal of the integrated circuit device. It is not necessary, as it was in the prior art, to exercise the clock device pin in order to enter or affect the test mode. Since the clock signal is internally forced, testing of the clock signal in two logic states, both a high logic state and a low logic state, is possible. Thus, the clock is testing in both a memory cell stress test mode and in a periphery stress test mode. The exercise of the clock signal in both logic states is an important advantage since the clock signal is typically connected to many gates of the synchronous integrated circuit device.

Since the test mode is entered internally and the clock signal is internally forced, the test is more reliable than it is to exercise the clock device pin to enter the test mode; one need not worry about pin continuity problems during testing since the device is internally clocked. Also, because the clock pin need not be probed to enter the test mode, the number of pins which must be exercised by test equipment is reduced and thus more devices may be simultaneously tested due to the reduced pin count.

A further advantage of the present invention is provided by powering-up the integrated circuit device in the test mode, rather than switching to the test mode subsequent to powering-up the device as is done in the prior art. Powering-up the device in the test mode prevents the, huge current spikes which may result in a latch-up condition of the device.

The present invention is desirable in any system or device employing synchronous integrated circuits. Thus it is envisioned that the present invention is suitable for use in a number of device types, including: memory devices such as SRAM (static random access memory), DRAM (dynamic random access memory) and BRAM (burst RAM) devices; programmable devices; logic devices; gate arrays; ASICs (application specific integrated circuits); and microprocessors. The present invention is further suitable for use in any system or systems which employ such devices types.

While the invention has been particularly shown and described with reference to a preferred embodiment, it will be understood by those skilled in the art that various changes in form and detail may be made therein without departing from the spirit and scope of the invention. For instance, the address path circuitry shown in the figures is but one example of how the circuitry and methodology of the present invention may be implemented.

What is claimed is:

1. Circuitry for controlling a clock signal of an integrated circuit device such that a data path of the integrated circuit device is initialized in a test mode, comprising:

a first logic element, having a first control signal as a first input signal and a second control signal as a second input signal and generating a first logic element output signal;

a first inverter element which inverts the first logic element output signal to produce a first inverter element output signal;

a second logic element, having the first inverter element output signal as a first input signal and a power-on-reset signal as a second input signal and generating a second logic element output signal;

a third logic element, having the second logic element output signal as a first input signal and the second control signal as a second input signal and generating a third logic element output signal;

a second inverter element which inverts the third logic element output signal to produce a second inverter element output signal;

a fourth logic element, having the first control signal as a first input signal and the second logic element output signal as a second input signal and generating a fourth logic element output signal;

a third inverter element which inverts the fourth logic element output signal to produce a third inverter element output signal; and a logic cell, having the second inverter element output signal as a first input signal, the third inverter element output signal as a second input signal, and the clock signal as a third input signal and generating a derivative clock signal.

2. The circuitry of claim 1, wherein the first logic element is a NAND logic gate, the second logic element is a NAND logic gate, the third logic element is a NAND logic gate and the fourth logic element is a NAND logic gate.

3. The circuitry of claim 1, wherein the first inverter element is an inverter, the second inverter element is an inverter and the third inverter element is an inverter.

4. The circuitry of claim 1, wherein the clock signal is an external clock signal of the integrated circuit device or a derivative signal of the external clock signal.

5. The circuitry of claim 1, wherein the logic cell further comprises:

a first transistor element, having a first terminal connected to a first supply voltage and a control terminal controlled by the second inverter element output signal;

a second transistor element, having a first terminal connected to a second terminal of the first transistor element and a control terminal controlled by the clock signal;

a third transistor element, having a first terminal connected to a second terminal of the second transistor element and a control terminal controlled by the clock signal;

a fourth transistor element, having a first terminal connected to a second terminal of the third transistor element, a control terminal controlled by the third inverter element output signal and a second terminal connected to a second supply voltage;

a fifth transistor element, having a first terminal connected to the second terminal of the second transistor and the first terminal of the third transistor, a control terminal controlled by the second inverter element output signal and a second terminal connected to the second supply voltage; and a sixth transistor element, having a first terminal connected to the first supply voltage, a control terminal controlled by the third inverter element output signal and a second terminal connected to the first terminal of the fifth transistor element, the second terminal of the second transistor element and the first terminal of the third transistor element to form the derivative clock signal;

wherein the first control signal and the second control signal allow the derivative clock signal to be forced to a first logic state or a second logic state regardless of the logic state of the clock signal.

6. The circuitry of claim 5, wherein the logic cell is a TTL (transistor transistor logic) logic cell.

7. The circuitry of claim 5, wherein the first supply voltage is Vcc and the second supply voltage is Vss.

8. The circuitry of claim 5, wherein the first transistor element is a p-channel transistor, the second transistor element is a p-channel transistor, the third transistor element is an n-channel transistor, the fourth transistor element is an n-channel transistor, the fifth transistor element is an n-channel transistor and the sixth transistor element is a p-channel transistor.

9. The circuitry of claim 8, wherein the logic cell is a TTL (transistor transistor logic) logic cell.

10. The circuitry of claim 1, wherein the integrated circuit device is a synchronous clocked device.

11. The circuitry of claim 1, wherein upon a power-up condition the circuitry for controlling the clock signal forces the clock signal to a first logic state thereby allowing conduction of a master element and upon completion of the power-up condition the clock signal is forced to a second logic state thereby allowing conduction of a slave element, and wherein conduction of the master element and the slave element initializes an address path of the integrated circuit device such that a plurality of columns and a plurality of rows of the integrated circuit device are not selected.

12. The method of claim 1, wherein upon a power-up condition the circuitry for controlling the clock signal forces the clock signal to a first logic state thereby allowing conduction of a master element and upon completion of the power-up condition the clock signal is forced to a second logic state thereby allowing conduction of a slave element, and wherein conduction of the master element and the slave element initializes an address path of the integrated circuit device such that a plurality of columns and a plurality of rows of the integrated circuit device are selected.

13. The method of claim 12, wherein upon conduction of the master element and the slave element to initialize the addressed path of the integrated circuit device, a plurality of bitlines true of the integrated circuit device are held at a first voltage level and a plurality of bitlines complement of the integrated circuit device are held at a second voltage level.

* * * * *